United States Patent
Tsai

(10) Patent No.: US 8,176,394 B2
(45) Date of Patent: May 8, 2012

(54) LINEAR FEEDBACK SHIFT REGISTER STRUCTURE AND METHOD

(75) Inventor: Shang-Nien Tsai, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 1019 days.

(21) Appl. No.: 12/101,290

(22) Filed: Apr. 11, 2008

(65) Prior Publication Data

US 2009/0257547 A1 Oct. 15, 2009

(51) Int. Cl.
*G06F 11/00* (2006.01)

(52) U.S. Cl. ......................................... 714/781

(58) Field of Classification Search .................. 714/781
See application file for complete search history.

(56) References Cited

U.S. PATENT DOCUMENTS

| | | | |
|---|---|---|---|
| 4,747,105 A * | 5/1988 | Wilson et al. ............... | 714/707 |
| 5,991,898 A * | 11/1999 | Rajski et al. ................ | 714/30 |
| 6,167,553 A | 12/2000 | Dent | |
| 6,188,714 B1 * | 2/2001 | Yamaguchi ................ | 375/130 |
| 6,640,236 B1 * | 10/2003 | Lupin et al. ................ | 708/250 |
| 7,702,706 B2 | 4/2010 | Van Berkel et al. | |
| 2007/0208975 A1 * | 9/2007 | Katti et al. ................. | 714/727 |
| 2007/0294327 A1 * | 12/2007 | Rajski et al. ............... | 708/252 |
| 2009/0222667 A1 * | 9/2009 | Vauclair et al. ............ | 713/175 |
| 2010/0083063 A1 * | 4/2010 | Rajski et al. ............... | 714/726 |

FOREIGN PATENT DOCUMENTS

| | | |
|---|---|---|
| CN | 1154292 | 6/2004 |
| CN | 1560914 | 1/2005 |
| CN | 1768326 | 5/2006 |

OTHER PUBLICATIONS

English language translation of abstract of CN 1154292 (published Jun. 16, 2004).
English language translation of abstract of CN 1560914 (published Jan. 5, 2005).
English language translation of abstract of CN 1768326 (published May 3, 2006).

* cited by examiner

*Primary Examiner* — Bryce Bonzo
(74) *Attorney, Agent, or Firm* — Thomas|Kayden

(57) ABSTRACT

An LFSR module is configured according to a characteristic polynomial for generating an output stream according to an input stream. The LFSR module has several LFSRs coupled together and an output generator. Each LFSR respectively receives a sub-input stream and at least one feedback stream, and respectively generates a sub-output stream and a feedback stream according to the received sub-input stream and the received at least one feedback stream, wherein the sub-input stream is generated according to the input stream, and at least one of the received feedback streams is generated by another LFSR. The output generator generates the output stream according to a plurality of inputs, wherein some of the inputs are the sub-output streams of the LFSRs.

25 Claims, 17 Drawing Sheets

LINEAR FEEDBACK SHIFT REGISTER STRUCTURE AND METHOD

BACKGROUND OF THE INVENTION

1. Field of the Invention

The invention relates to linear feedback shift-registers (LFSRs) and more particularly to an LFSR module comprising parallel LFSRs.

2. Description of the Related Art

Linear feedback shift-register (LFSR) circuits have been used to create parity check to enhance data integrity in complex very large scale integrated (VLSI) circuits containing thousands of interconnected circuits. LFSRs have also produced signatures at the outputs of a DUT (device under test) to represent current states corresponding to prior states and received response signals.

Reviewing first some pertinent principles that govern LFSRs, FIG. 1 shows a conventional sequential LFSR 100 for generating an output stream OUT according to an input stream IN=$\{I_0, I_1, I_2, \ldots, I_{L-1}\}$, where L denotes the symbol number of the input stream IN. As shown, the LSFR 100 comprises a plurality of stages 110(0)-110(X), an end stage 120 and an output generator 130. The stages can be implemented as a beginning stage 110(0), at least one intermediate stage of stages 110(1)-110(X), and an end stage 120. The input stream IN and the intermediate stream Rx are provided sequentially to a summing device 121 in the end stage 120 for generating the feedback stream SF. The feedback stream SF is then fed into all of the beginning and intermediate stages 110(0)-110(X). Each beginning stage and intermediate stage 110[i] comprises a logic network 111[i] and a registering device 112[i] (such as the flip flop shown in FIG. 1) for respectively generating an intermediate stream $R_i$ and storing the received symbol of the intermediate stream Ri. The logic network 111[i] comprises a multiplier 114[i] multiplying the symbol of the feedback stream SF[i] by a respective multiplication factor Ci and an adding device 115(i) (except in the beginning stage 110(0)) adding output symbol of the multiplier 114[i] and the symbol of the intermediate stream $R_{(i-1)}$ received from the preceding stage for generating the intermediate stream $R_i$, wherein 'i' described above is from 0 to X. Because the registering devices are clocked through subsequent clock cycles, one symbol of the input stream IN is fed into the end stage 120 and symbols of the intermediate streams $R_0$-$R_X$ stored in the registering devices in one stage are shifted to the next stage. The symbols of the intermediate stream $R_i$ generated after the $n_{th}$ symbol of the fed input stream may thus be expressed as $R_i(n)$, where $0 \leq n \leq L-1$. It is noted that the symbol can express a segment having several corresponding bits of the sub-output streams of the LFSRs.

The output generator 130 comprises a switch 131 initially set to output the intermediate stream IN=$\{I_0, \ldots, I_{L-1}\}$. After all symbols of the input stream IN are fed into and processed in the stages, the last generated symbols $R_0(L-1)$-$R_X(L-1)$ of the intermediate streams $R_1$-$R_X$ are sequentially provided to output generator 130 to act as the succeeding symbols of the output stream OUT. Accordingly, the output stream OUT comprises $\{O_1, O_2, \ldots, O_X\}$=$\{I_0, I_1, \ldots I_{L-1}, R_X(L-1), R_1[L-1], \ldots, R_0(L-1)\}$. In some applications, the last generated symbols $R_0(L-1)$-$R_X(L-1)$ of the intermediate streams $R_1$-$R_X$ may be provided directly as the output stream OUT, that is, the output stream OUT comprises $\{O_1, O_2, \ldots, O_X\}$=$\{R_X(L-1), \ldots, R_1[L-1], R_0(L-1)\}$.

The identity of the LFSR 100 can be characterized by means of a polynomial (a so called characteristic polynomial) expression with coefficients corresponding to the multiplication factors $C_0$-$C_X$ of the multipliers 114[0]-114[X]. Thus, the characteristic polynomial for the LFSR 100 of FIG. 1 is:

$$P(x) = \sum_{i=0}^{X} C_i x^i + x^{X+1}.$$

In polynomial expressions, the LFSR module 100 is implemented as a finite field polynomial divider where the input stream IN corresponds to a dividend polynomial D(x), the characteristic polynomial corresponds to a divisor polynomial P(x), the feedback stream SF corresponds to a quotient polynomial, corresponding symbols $R_1(n)$-$R_X(n)$ generated at one clock cycle of the intermediate streams $R_0$-$R_X$ correspond to an intermediate remainder polynomial generated during division of the dividend polynomial D(x) by the characteristic polynomial P(x), and the output stream OUT in the form of $\{R_0(L-1), R_1[L-1], \ldots, R_X(L-1)\}$ corresponds to a remainder polynomial R[x] of the dividend polynomial D(x) divided by the characteristic polynomial [divisor polynomial] P(x). That is, D(x)=P(x)Q[x]+R[x], wherein Q[x] is a quotient polynomial.

Classic LFSRs, as described in FIG. 1, are sequential. Values are shifted from one shift-register stage to the next by a clock until they eventually exit via an LFSR output. It is well known that sequential operations are slow in nature and must therefore be compensated by running the LFSR at high speeds. For high end systems, high speed data generation and compression can only be achieved by high performance circuits and a high speed clock. High speed circuits have high power and thermal requirements, consuming considerably more system space.

BRIEF SUMMARY OF THE INVENTION

Accordingly, the invention provides a LFSR module for generating random test patterns or a signature from an input stream at ultra high speed. The LFSR may be implemented with low speed circuit components and a slow clock rate.

According to one embodiment of the invention, an LFSR module is configured according to a characteristic polynomial for generating an output stream according to an input stream. The LFSR module has several LFSRs coupled together and an output generator. Each LFSR respectively receives a sub-input stream and at least one feedback stream, and respectively generates a sub-output stream and a feedback stream according to the received sub-input stream and the received at least one feedback stream, wherein the sub-input stream is generated according to the input stream, and at least one of the received feedback streams is generated by another LFSR. The output generator generates the output stream according to a plurality of inputs, wherein some of the inputs are the sub-output streams of the LFSRs.

According to another embodiment of the invention, a method is used to generate an output stream according to an input stream by operating with a characteristic polynomial and a linear feedback shift-register (LFSR) module having a plurality of LFSRs. The method comprises respectively receiving a sub-input stream and at least one feedback stream, and respectively generating a sub-output stream and a feedback stream according to the received sub-input stream and the received at least one feedback stream, and generating the output stream according to a plurality of inputs. Wherein the sub-input stream is generated according to the input stream, at least one of the received feedback streams is generated by another LFSR, and some of the inputs are the sub-output streams of the LFSRs.

Preferably, the sub-output stream of each of the LFSRs corresponds to a decimation of coefficients of the remainder polynomial, and the respective resulting sub-output stream of each of the LFSRs corresponds to the decimation of the coefficients of the remainder polynomial with a predetermined decimation interval equal to the number of LFSRs. Additionally, each of the LFSRs further generates a plurality of intermediate streams, wherein corresponding symbols of the intermediate streams correspond to a decimation of coefficients of an intermediate remainder polynomial generated during division of the dividend polynomial by the characteristic polynomial with a predetermined decimation interval equal to the number of LFSRs.

Because each of the LFSRs must generate a decimation of coefficients of an intermediate remainder polynomial, the number of stages each of the LFSRs is reduced and the encoding time or the encoding frequency is also reduced.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
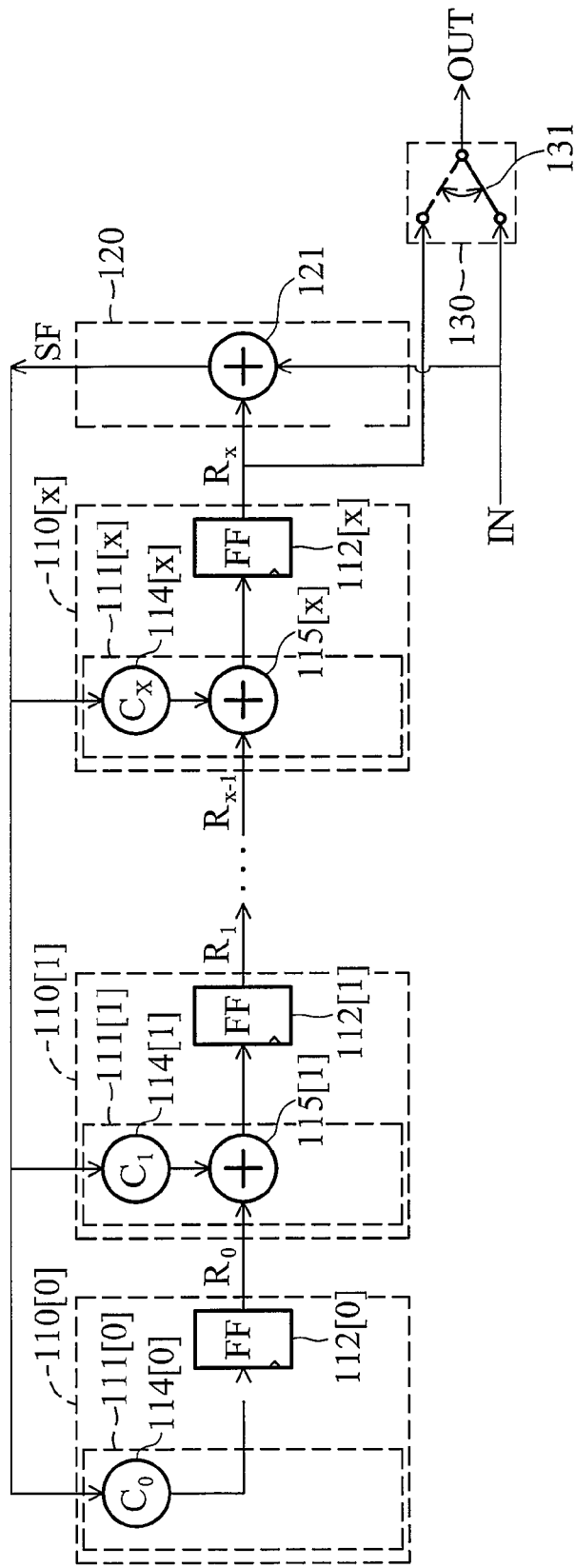
FIG. 1 shows a conventional sequential LFSR of prior art.
Figure 2:
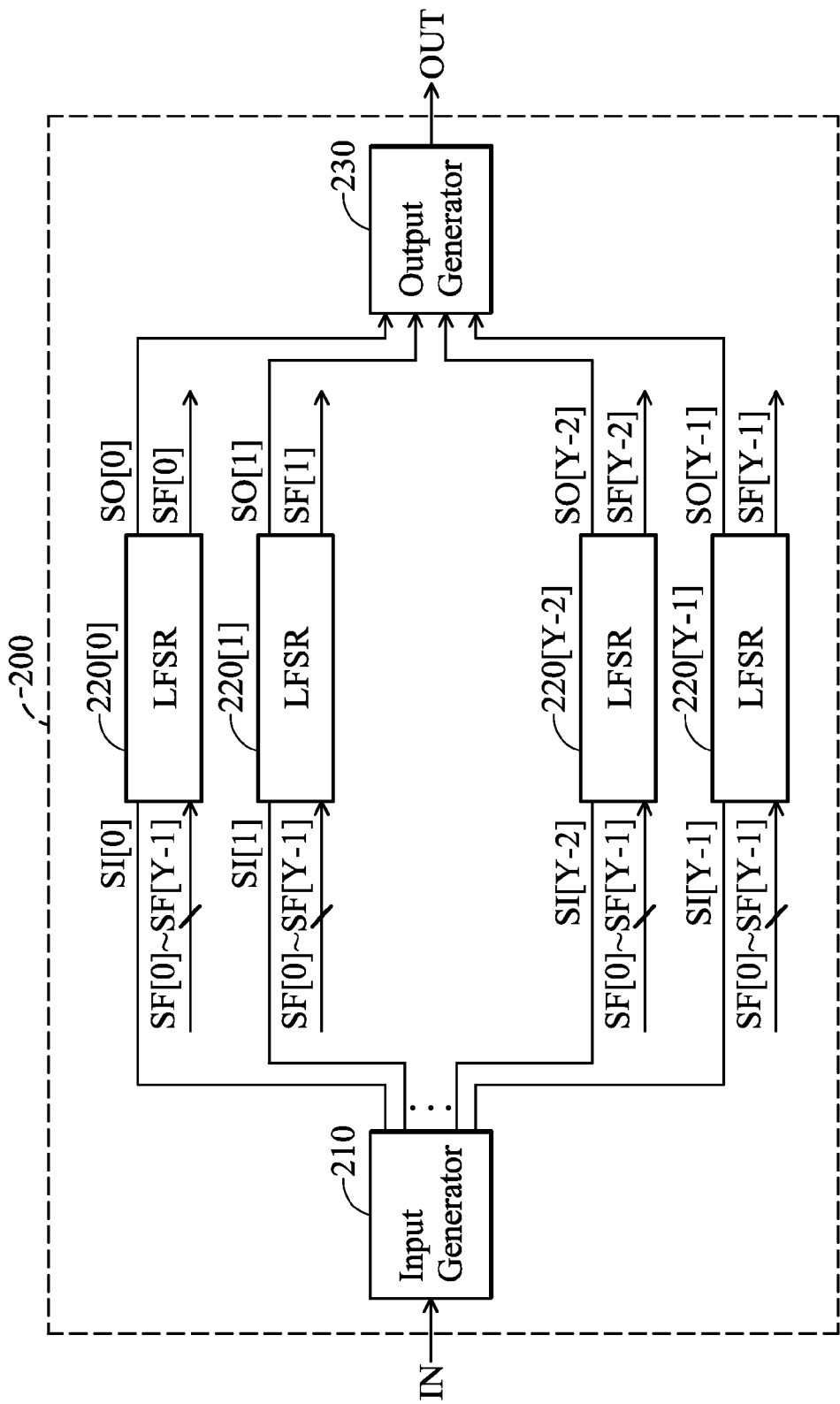
FIG. 2 shows a block diagram of an embodiment of an LSFR module of the invention.

FIG. 2 is a block diagram of a LSFR module 200 in accordance with an embodiment of the invention. The LFSR module 200 is configured according to a characteristic polynomial $$P(x) = \sum_{i=0}^{X} C_i x^i + x^{X+1}$$

for generating an output stream OUT according to an input stream $IN\{=I_0, I_1, I_2, \ldots, I_{L-1}\}$, where L denotes the symbol number of the input stream IN. As shown, the LFSR module 200 comprises an input generator 210, a number of LFSRs 220[0]-220[Y-1] (Y≧2), and an output generator 230. It is noted that the symbol can express a segment having several corresponding bits of the sub-output streams of the LFSRs, i.e. the segment can be taken as several bits, a byte or several bytes.

The input generator 210 receives the input stream IN to generates Y sub-input streams SI[0]-SI[Y-1] accordingly, and the LFSRs 220[0]-220[Y-1] receives the sub-input streams SF[0]-SF[Y-1] respectively. It is noted that the respective sub-input stream of each of the LFSRs comprises a subset of the input stream.

The LFSR 220[i] [for each i satisfying 0≦i≦Y-1] receives the respective sub-input stream SI[i] from the input generator 210 and at least one of a plurality of feedback streams SF[0]-SF[Y-1] respectively generated by the LFSRs 220[0]~220[Y-1]. Preferably, the at least one feedback stream received by the LFSR 220[i] for each i comprises the feedback stream SF[i] generated by the same LFSR 220[i] and at least one feedback stream SF[j] respectively generated by another LFSR 220[j], where j≠i. In the embodiment shown in the figure, all of the feedback streams SF[0]-SF[Y-1] are fed into each of the LFSRs 220[0]~220[Y-1]. The LFSR 220[i] then generates a respective sub-output stream SO[i] and the respective feedback stream SF[i] according to the received sub-input stream SI[i] and the received at least one feedback stream (all of the feedback streams SF[0]-SF[Y-1] in the embodiment of FIG. 2).

The output generator 230 receives the sub-output streams SO[0]~SO[Y-1] from the LFSRs 220[0]~220[Y-1] respectively, and generates the output stream OUT according to the received sub-output streams SO[0]~SO[Y-1] after all of the sub-input streams SI[0]~SI[Y-1] fed into the LFSRs 220[0] ~220[Y-1] respectively. Note that, in other embodiments for other applications, the input stream IN or the sub-input streams SI[0]~SI[Y-1] are also provided to the output generator 230, and the output generator 230 generates the output stream OUT according to both the sub-output streams SO[0] ~SO[Y-1] and the sub-input streams SI[0]~SI[Y-1].

In some embodiments, the LFSR module 200 is implemented as a finite field polynomial divider where the input stream IN corresponds to a dividend polynomial D(x), the characteristic polynomial corresponds to a divisor polynomial P(x), and the output stream OUT corresponds to a remainder polynomial R[x] of the dividend polynomial D(x) divided by the characteristic polynomial [divisor polynomial] P(x). That is, D(x)=P(x)Q[x]+R[x], wherein Q[x] is a quotient polynomial.

Configurations of the LFSRs 220[0]~220[Y-1], determination of the sub-input streams SI[0]~SI[Y-1] from the input stream IN, the data structures of the feedback streams SF[0]-SF[Y-1] and the sub-output streams SO[0]~SO[Y-1], and determination of the output stream OUT from the sub-output streams SO[0]~SO[Y-1], are contemplated in the invention to make the LFSR module 200 provide the same output streams OUT as the LFSR 100 when receiving the same input stream IN, as described in detail in the following.

Figures 1, 3A:
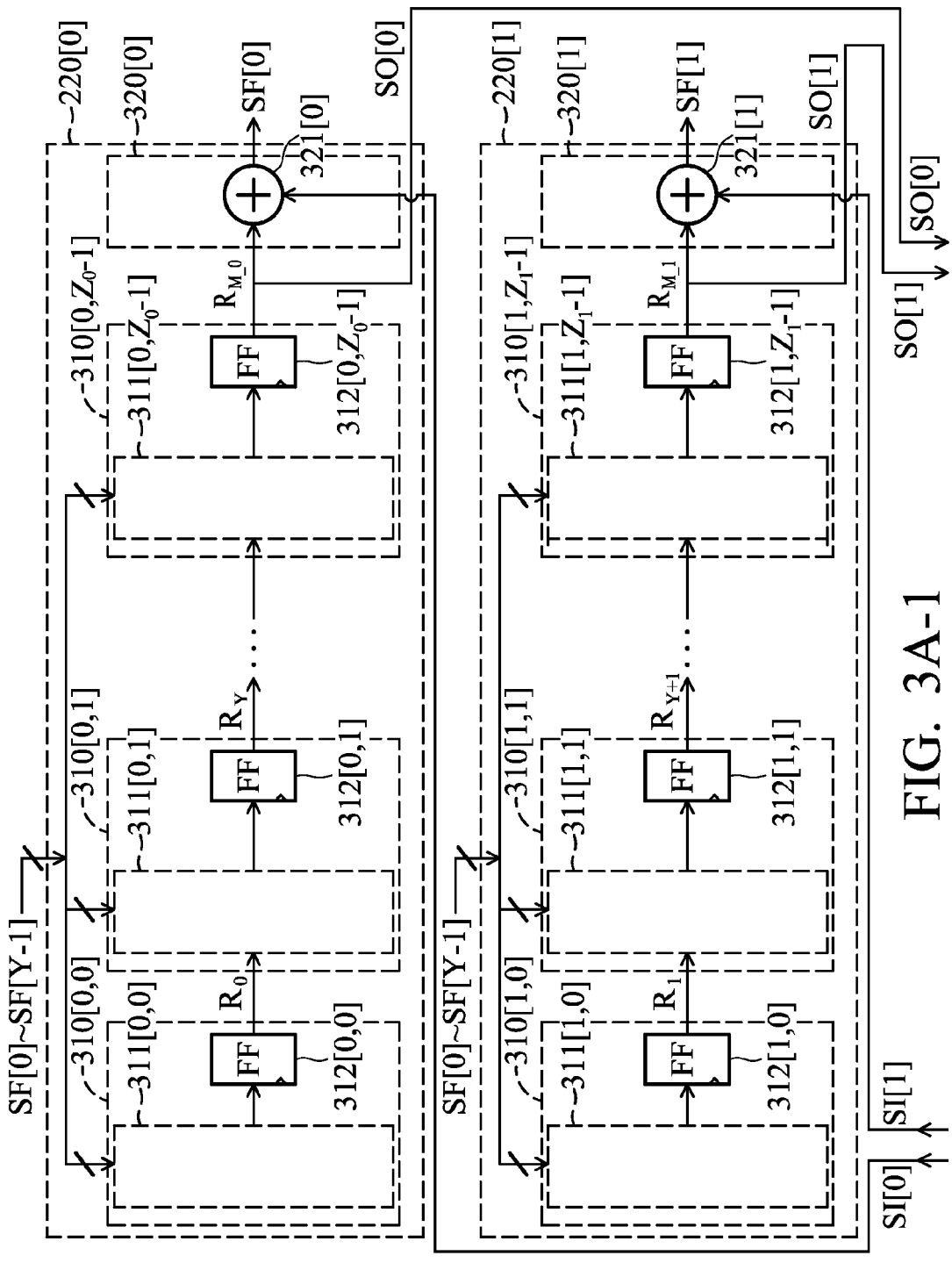
FIGS. 3A and 3B are more-detailed block diagrams of an LSFR module in accordance with two embodiments of FIG. 2.
Figures 2, 3A:
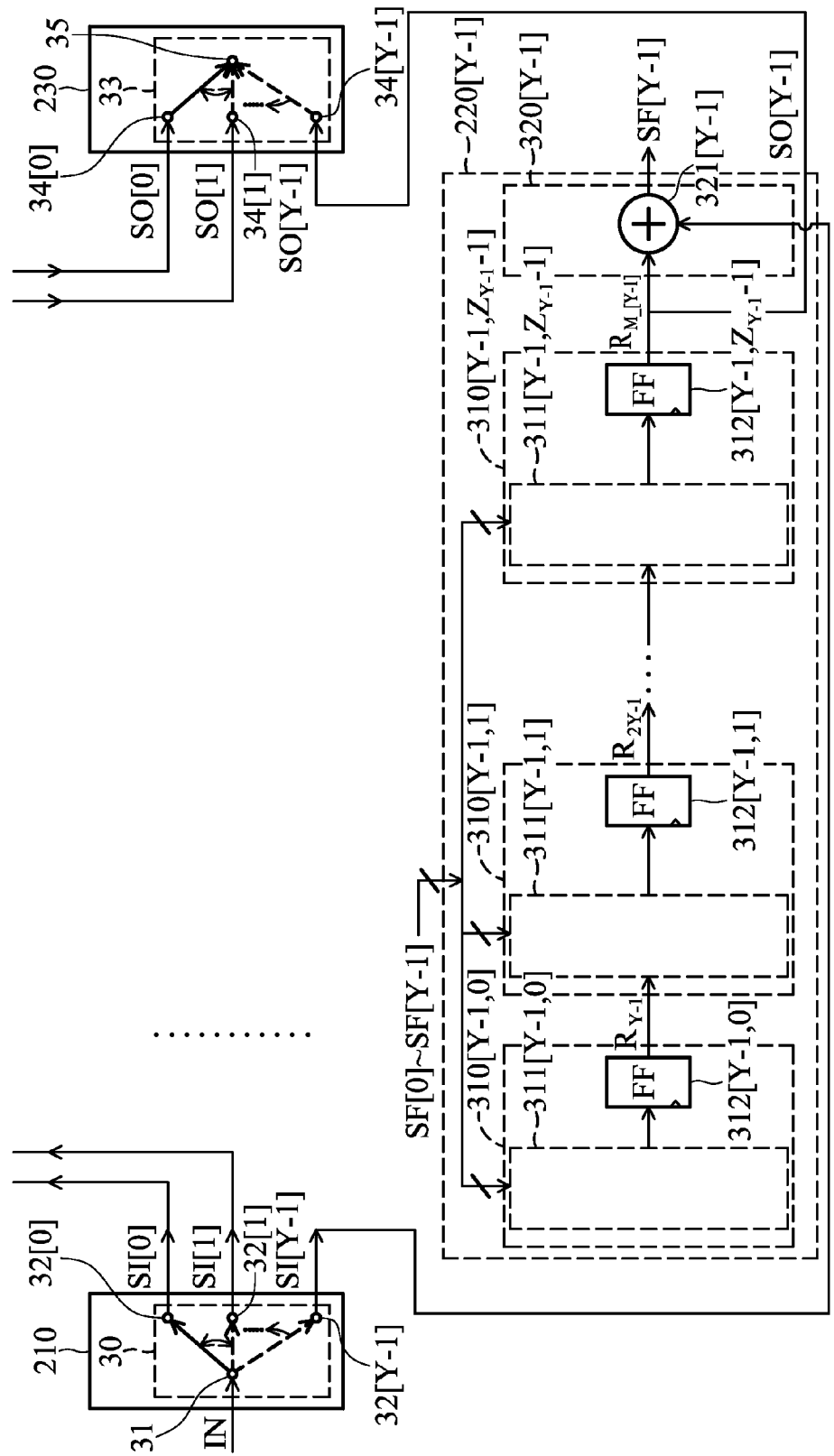
Figures 1, 3B:
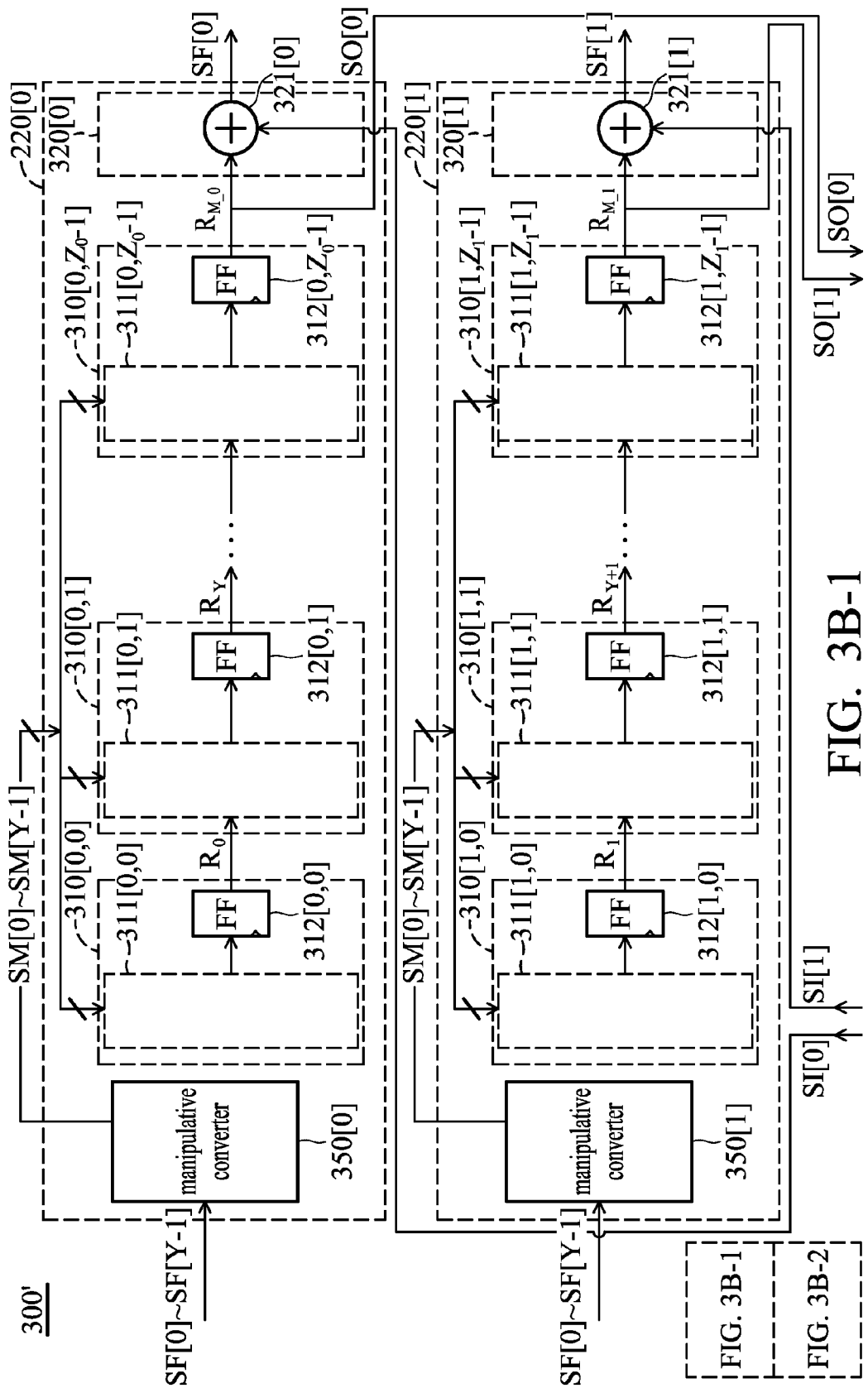
Figures 2, 3B:
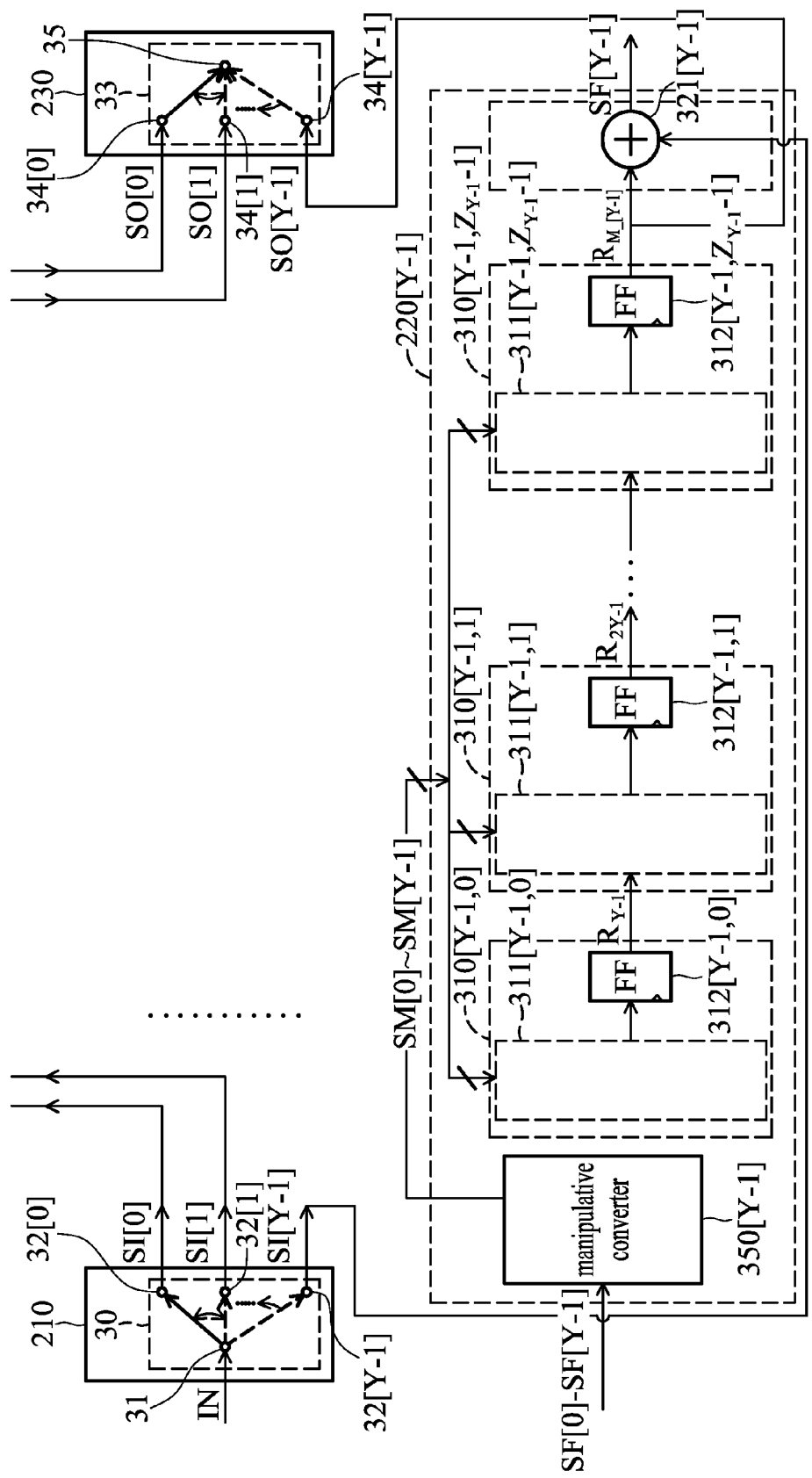

FIGS. 3A and 3B are respective more-detailed block diagrams of LSFR modules 300 and 300' in accordance with two embodiments of FIG. 2 of the invention. The input generator 210 decimates the input stream IN with a decimation interval equal to the number of LFSRs to synchronously produce the sub-input streams SI[0]~SI[1].

Figure 3C:
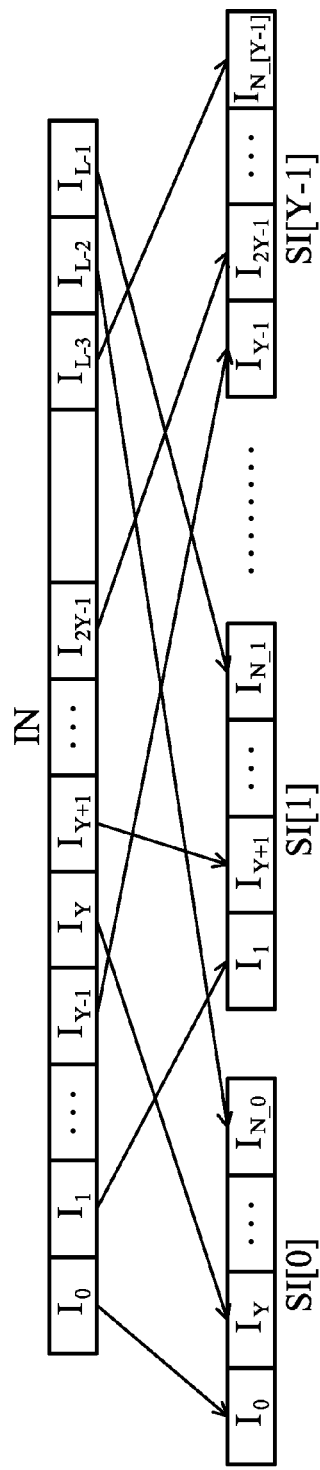
FIG. 3C illustrates the decimation process of the input stream in the input generator of FIGS. 3A and 3B.

Refer to FIG. 3C first; FIG. 3C illustrates the decimation process of the input stream IN in the input generator 210. As shown in FIG. 3C, the sub-input streams SI[0]~SI[Y-1] comprise the following symbols of the input stream IN, respectively:

Sub-input stream $SI[0]\{I_0, I_Y, I_{2Y}, I_7, \ldots, I_{N\_0}\}$, .

Sub-input stream $SI[1]\{I_1, I_{Y+1}, I_{2Y+1}, \ldots, I_{N\_1}\}$, $\ldots$

Sub-input stream $SI[Y-1]=\{I_{Y-1}, I_{2Y-1}, I_{3Y-1}, \ldots, I_{N\_[Y-1]}\}$ The integers N_0 to N_[Y-1] depend on the symbol number L of the input stream IN and the number Y of the LFSRs 220[0]~220[Y-1]. For example, if L=20 and Y=2, then N_0 and N_1 are respectively 18 and 19. Mathematically, if the number of LFSRs is Y, then the $(n \times Y+i+1)_{th}$ symbols of the input stream IN are provided sequentially as the sub-input stream of the $(i+1)_{th}$ LFSR, where 'n' are integers satisfying $n \geq 0$, and 'i' are integers satisfying $0 \leq i \leq (Y-1)$. The input generator 210 then provides the sub-input streams SI[0]~SI[Y-1] respectively to their associated LFSRs 220[0]~220[Y-1].

In FIG. 3A, the input generator 210 may be implemented as a switch 30 transmitting the input stream IN to one of Y output terminals 32[0]~32[Y-1] which are respectively connected to the LFSRs 220[0]~220[Y-1]. When sequentially fed by the symbols of the input stream IN, the switch 30 switches sequentially such that the terminal 31 connect to one of the output terminals 32[0]~32[Y-1] by turns.

The LFSR 220[i], where i denotes the $(i+1)_{th}$ LFSR from top to down and $0 \leq i \leq (Y-1)$, similar to the LFSR 100 for each value of i, comprises a beginning stage 310[i,0], intermediate stages 310[i,1] to 310[i, $Z_i$-1], and an end stage 320[i] coupled in a series for sequential propagation of signals therethrough. The number $Z_i$ of the intermediate stages depends on both the order X+1 of the characteristic polynomial P(x) and the number Y of LFSRs, as is described in the following. It is noted that the stages comprises a logic network (such as 311[0,0]) and a registering (such as the device 312[0,0], flip flop).

Similar to LFSR 100, the last intermediate stage 310[i, $Z_i$-1] for each i generates an intermediate stream as described in the following as the sub-output stream SO[i]. Additionally, the sub-input stream SI[i] and the intermediate stream $R_{X\_Y+i+1}$ are both provided to the end stage 320[i] symbol-by-symbol to sequentially generate the feedback stream SF[i]. Preferably, the end stage 320[i] comprises a summing device 321[i] sequentially adding the currently received symbols of the sub-input stream SI[i] and the intermediate stream to produce the feedback stream SF[i]. Different from the LFSR 100, all of the feedback streams 'SF[0]-SF[Y-1]' rather than only the feedback stream SF[i] are fed directly into LFSR 220[i].

Also similar to LFSR 100, each of the beginning stage 310[i,0] and the intermediate stages 310[i,j], where j satisfies $1 \leq j \leq Z_i - 1$, comprises a logic network 311[i,j] and a registering device 312[i,j]. Here, the logic network 311[i,j] is implemented for generating and provides the intermediate stream $R_{Y*j+i}$ to the registering device 312[i,j], where the intermediate stream $R_{Y*j+i}$ is used to provide the same output stream OUT when receiving the same input stream IN. More specifically, the LFSRs 220[0]~220[Y-1] generate the intermediate streams respectively:

LFSR[0]: $R_0$, $R_Y$, . . . , $R_{M\_0}$,
LFSR[1]: $R_1$, $R_{Y+1}$, . . . , $R_{M\_1}$,
. . .
LFSR[Y-1]: $R_{Y-1}$, $R_{2Y-1}$, . . . $R_{M\_(Y-1)}$.

As described, combination of symbols of the intermediate streams $R_0$-$R_X$ correspond to an intermediate remainder polynomial generated during division of the dividend polynomial D(x) (corresponding to the input stream IN) by the characteristic polynomial P(x).

The integers M_0 to M_[Y-1] thus depend on the order X+1 of the characteristic polynomial P(x) and the number Y of the LFSRs 220[0]~220[Y-1]. For example, if X is odd and Y=2, then M_0 and M_1 are respectively (X-1) and X. If X is even and Y=2, then M_0 and M_1 are respectively X and (X-1). If X is odd and Y=2, then the number $Z_i$ of the beginning and intermediate stages in the LFSR 220[i] is thus [X+1]/2 for both i=0 and 1. Or if X is even and Y=2, then M_0 and M_1 are respectively X and (X-1). The numbers $Z_0$ and $Z_1$ are thus (X+2)/2 and X/2 respectively.

Figure 4A:
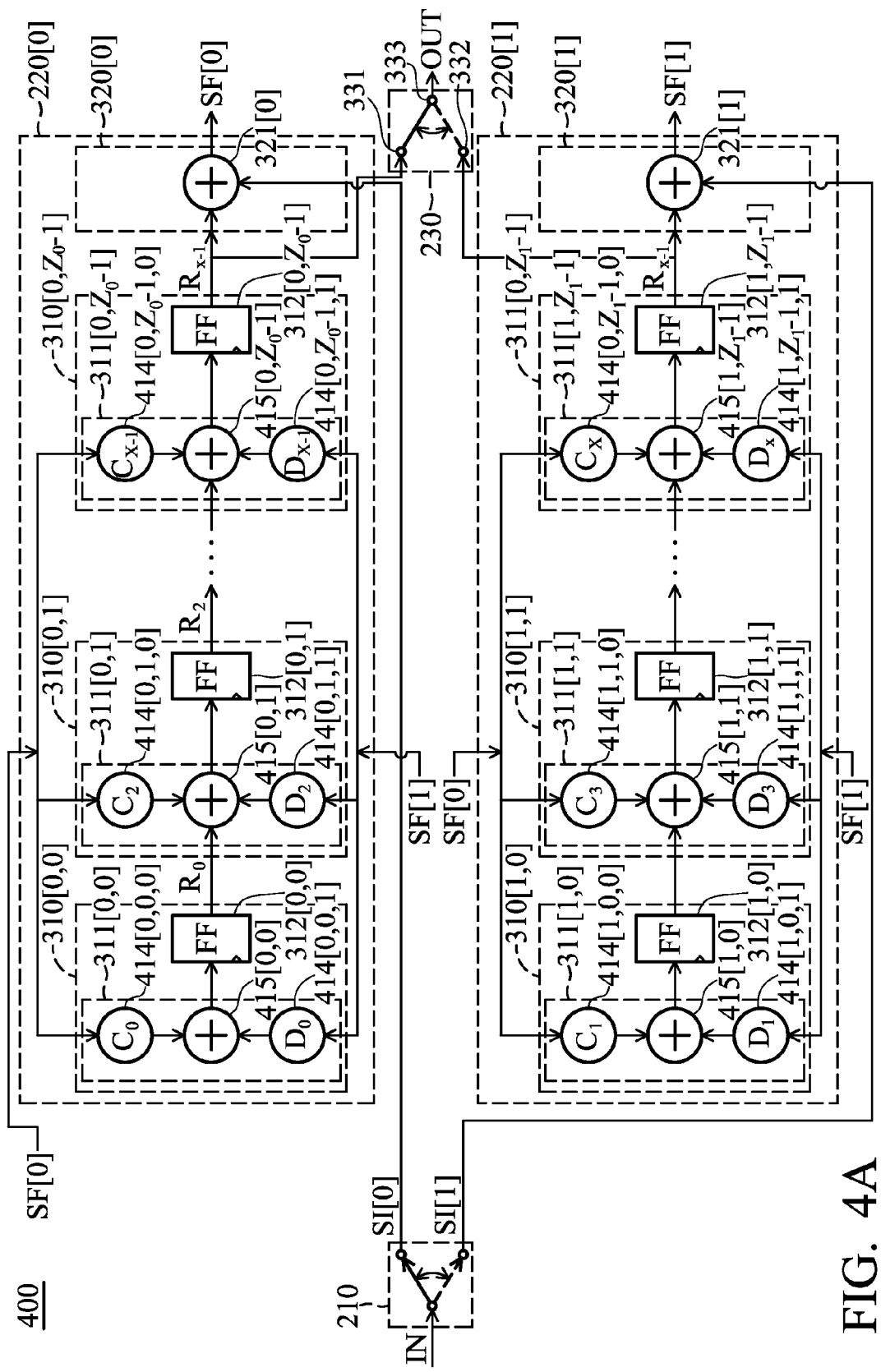
FIGS. 4A and 4B show more-detailed block diagrams of an LSFR module in accordance with two embodiments of FIG. 3A.
Figures 1, 4B:
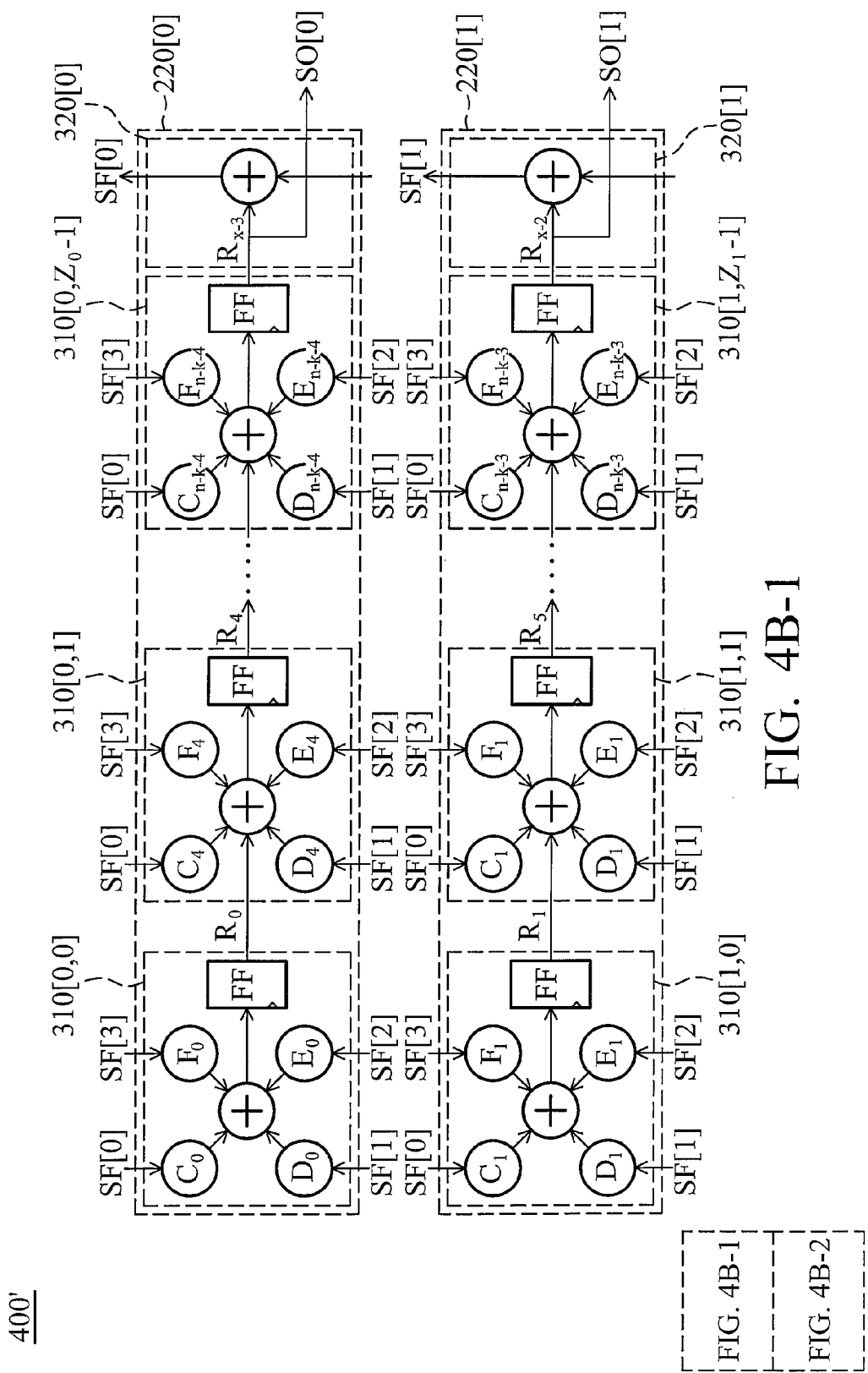
Figures 2, 4B:
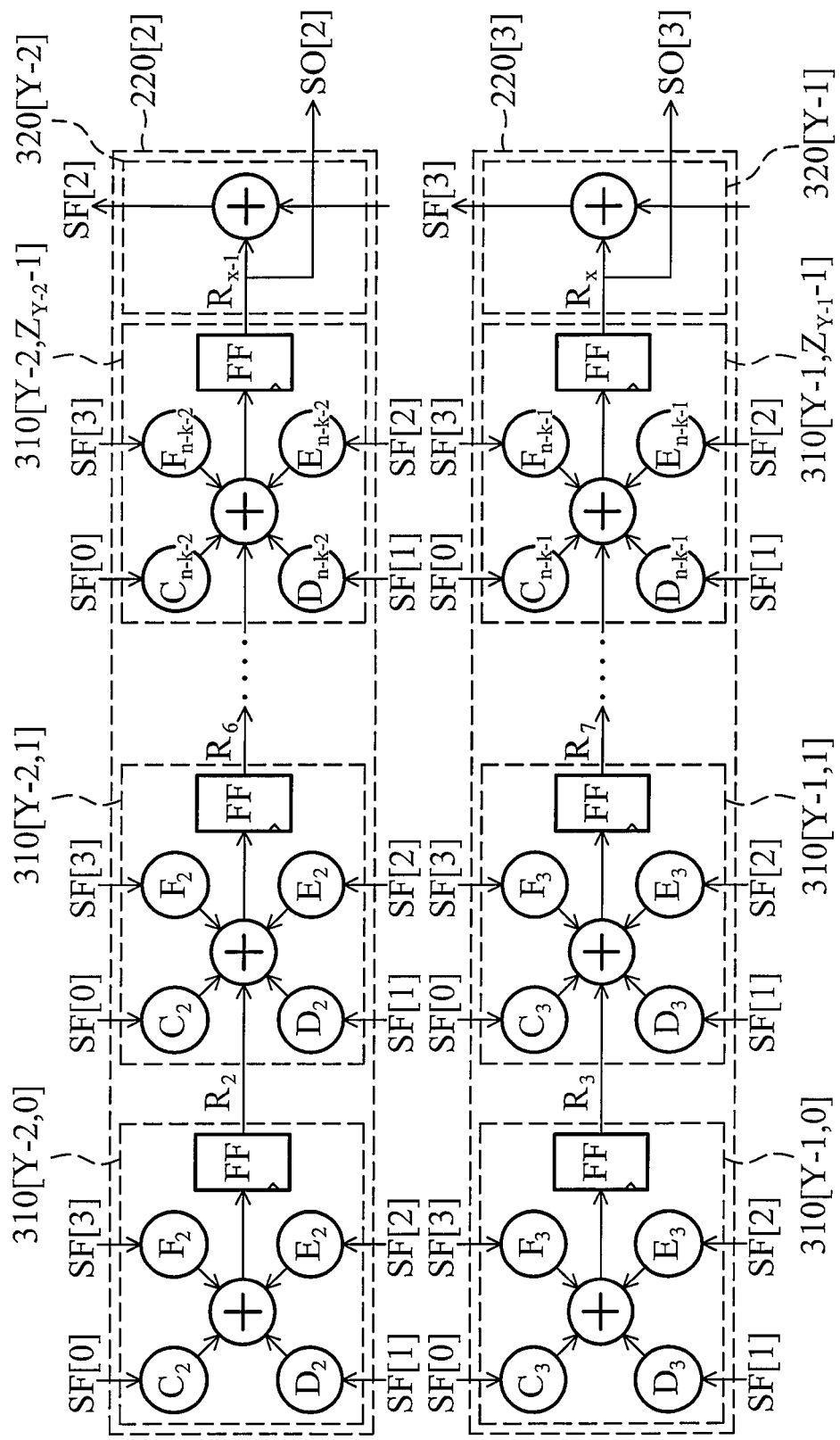

The registering device 312[ij] then stores the intermediate stream $R_{Y*j+i}$ received from the preceding logic network 311[i,j] and provides the intermediate stream $R_{Y*j+i}$ to the following logic network 311[i,j+1] in the next stage 310[i,j+1]. The registering device 312[i,j] can be implemented as a flip-flop as shown for example. A more detailed structure of the logic network 311[i,j] for each i and j is illustrated in FIGS. 4A and 4B.

The LFSRs 220[0]~220[Y-1] operate synchronously to receive the sub-input streams SI[0]~SI[Y-1] and simultaneously generate the sub-output streams SO[0]~SO[Y-1]. Similar to that in the LFSR 100, after all of the sub-input streams SI[0]~SI[Y-1] are fed into and processed in the LFSRs 220[0]~220[Y-1], the last generated symbols of the intermediate streams in the LFSRs 220[0]~220[Y-1] are still sequentially provided as the sub-output streams SO[0]~SO[Y-1]. More specifically, the symbols of each the sub-output streams SO[0]~SO[Y-1] after all of the sub-input streams SI[0]~SI[Y-1] fed into and processed in the LFSRs 220[0]~220[Y-1] are:

SO[0]: $R_0(N\_0)$, $R_Y(N\_0)$, . . . , $R_{M\_0}(N\_0)$,
SO[1]: $R_1(N\_1)$, $R_{Y+1}(N\_1)$, . . . , $R_{M\_1}(N\_1)$,
. . .
SO[Y-1]: $R_{Y-1}(N_{13}(Y-1))$, $R_{2Y-1}(N\_(Y-1))$, . . . , $R_{M\_(Y-1)}(N\_(Y-1))$, where $R_p(N\_i)$ denotes the last symbol of the intermediate stream $R_p$ after all symbols the sub-input streams SI[i] are fed into and processed in the LFSRs 220[i]. The output generator 230 then produces the output stream OUT by outputting the sub-output streams SO[0]-SO[Y-1] in an order of $SO_{[0,0]}$, $SO_{[1,0]}$, . . . $SO_{[Y-1,0]}$, $SO_{[0,1]}$, $SO_{[1,1]}$, . . . , $SO_{[Y-1,1]}$, . . . and so on, until all of the symbols of the sub-output streams SO[0]~SO[Y-1] are output, wherein the symbol $SO_{[p,q]}$ denotes the $(q+1)_{th}$ symbol of the sub-output stream SO[p].

Figure 3D:
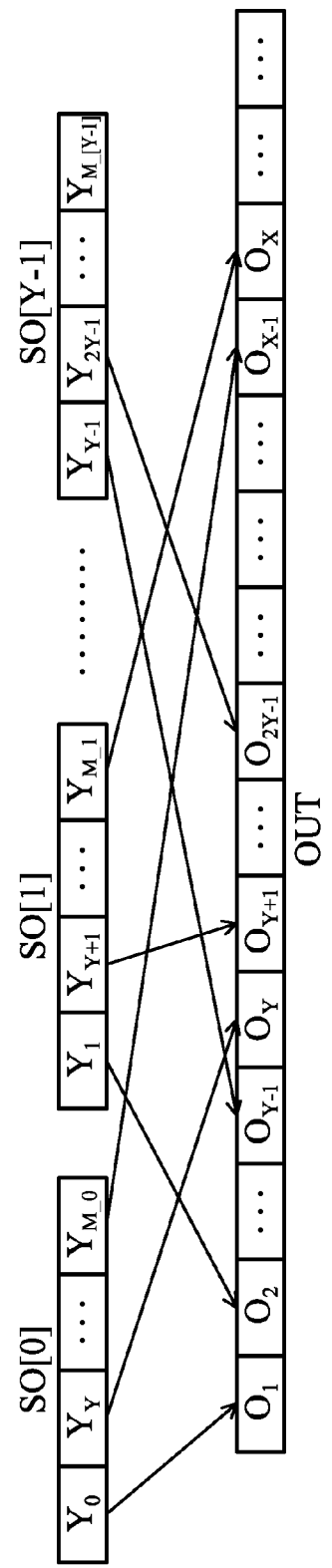
FIG. 3D illustrates the symbol output order of the sub-output streams in the output generator of FIGS. 3A and 3B.

FIG. 3D illustrates the output order of the symbols of the SO[0]~SO[Y-1] in the output generator 230. Compared to the decimation process shown in FIG. 3C, it is clear that FIG. 3D carries out a relative process. Accordingly, the output stream OUT comprises $\{O_1, O_2, . . . , O_X\} = \{R_0(N\_0), R_1(N\_1), . . . , R_{Y-1}(N\_(Y-1)), R_Y(N\_0), R_{Y+1}(N\_1), . . . , R_{2Y-1}(N\_(Y-1)), R_{M\_0}(N\_0), R_{M\_1}(N\_1), . . . , R_{M\_(Y-1)}(N\_(Y-1))\}$ corresponding to a remainder polynomial R[x] of the dividend polynomial D(x) (corresponding to the input stream IN) divided by the characteristic polynomial [divisor polynomial] P(x).

In FIGS. 3A and 3B, the output generator 230 may be implemented as a switch 33 with Y terminals 34[0]~34[Y-1] respectively transmitting the sub-output streams SO[0]~SO[Y-1] to a terminal 35 for outputting the output stream OUT as shown. When receiving the symbols of the sub-output streams SO[0]~SO[Y-1], the switch 33 switches sequentially such that one of the terminals 34[0]~34[Y-1] connects to the output terminal 35 by turns.

Note that in embodiments for other applications, the output generator 230 generates the output stream OUT by outputting the sub-input streams SI[0]~SI[Y-1] in the order of $SI_{[0,0]}$, $SI_{[1,0]}$, . . . $SI_{[Y-1,0]}$, $SI_{[0,1]}$, $SI_{[1,1]}$, . . . , $SI_{[Y-1,1]}$, . . . and so on, until all of the symbols of the SI[0]~SI[Y-1] are output, and then outputs the sub-output streams SO[0]~SO[Y-1] in the order of $SO_{[0,0]}$, $SO_{[1,0]}$, . . . $SO_{[Y-1,0]}$, $SO_{[0,1]}$, $SO_{[1,1]}$, . . . , $SO_{[Y-1,\ 1]}$, . . . and so on, until all the symbols of the SO[0]~SO[Y-1] are output, wherein the symbol $SO_{p,q}$ and $SI_{p,q}$ denote the $(q+1)_{th}$ symbols of the sub-output stream SO[p] and sub-input stream SI[p], respectively. More particularly, the sub-output streams generated later (such as SO[Y-2] and SO[Y-1]) can be viewed as resulting sub-output streams, and the resulting sub-output stream of each of the LFSRs corresponds to a subset of coefficients of the remainder polynomial. It means that each of the resulting sub-output streams corresponds to the subsets with different coefficients of the remainder polynomial.

Figure 3E:
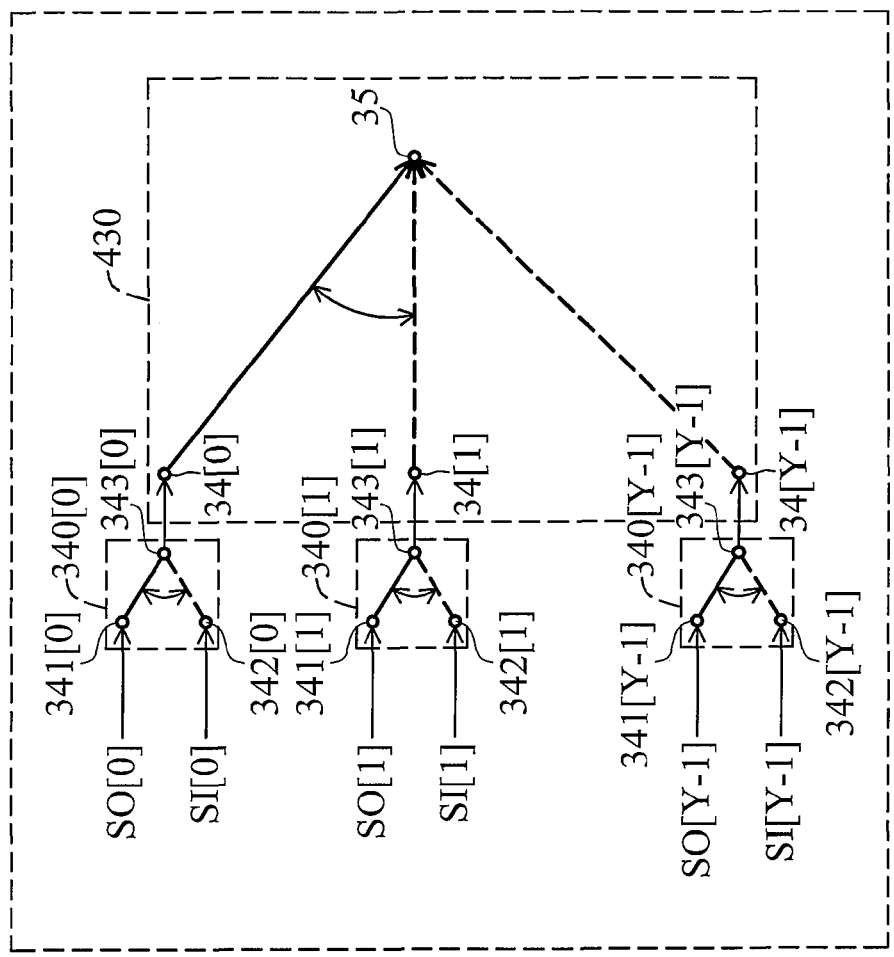
FIG. 3E shows a detailed diagram of the output generator according to an alternative embodiment of the invention.

Referring to FIG. 3E, a detailed diagram of the output generator 230 according to such an alternative embodiment of the invention is illustrated. The output generator 430 of FIG. 3E differs from that of FIG. 3A in the addition of switches 340[0]~340[Y−1] respectively arranged to switch between two terminals. The switch 340[i] for each i has two input terminals 341[i] and 342[i] respectively receiving the sub-output stream SO[i] and the sub-input stream SI[i] and one terminal 343[i] connecting to the terminal 34[i] of the switch 430. The switches 340[0]~340[Y−1] are first switched down, and the switch 430 switches sequentially such that one of the terminals 34[0]~34[Y−1] connects to the output terminal 35 by turns. After all of the symbols of the SI[0]~SI[Y−1] are output, the switches 340[0]~340[Y−1] are switched up and the switch 430 also switches sequentially such that one of the terminals 34[0]~34[Y−1] connects to the terminal 35 by turns.

As shown, the LFSR module 300' of FIG. 3B differs from the LFSR module 300 of FIG. 3A in the addition of a respective manipulative converter 350[i] in the LFSR 220[i] for each i. The manipulative converter 350[i] converts the feedback streams 'SF[0]-SF[Y−1]' into a plurality of manipulated streams 'SM[0]-SM[Y−1]'. Additionally, the beginning and intermediate stages 310[i,0]~310[I,Z_i] for each i receives the manipulated streams SM[0]-SM[Y−1] from the manipulative converter 350[i] rather than the feedback streams SF[0]-SF[Y−1]. Detailed structures of the logic network 311[i,j] and the manipulative converter 350[i] for each i and j are illustrated later in FIGS. 5A and 5B.

Since the LFSRs 220[0]~220[Y−1] operate synchronously and the number Zi of the stages in each of the LFSRs 220[0]~220[Y−1] in the LFSR modules 300 and 300' is smaller than the number Z of the beginning and intermediate stages (Z=X) in the LFSR 100, the encoding time (defined as the time required for generating one output stream) or the encoding frequency (defined as the frequency of the clocks fed into the flip-flops) in the LFSR modules 300 and 300' is thus about l/Y times that in the LFSR 100 for generating the same output stream OUT when receiving the same input stream IN.

FIG. 4A is a more-detailed block diagram of a LSFR module 400 in accordance with an embodiment of FIG. 3A of the invention where it is assumed for example that the number Y of LFSRs is 2, and the order X+1 of the characteristic polynomial P(x) is even.

As shown, the logic network 311[i,j] comprises two multipliers 414[i,j,k] (k is an integer and $0 \leq k \leq Y-1$, where Y=2 in the embodiment) and a summing device 415[i,j]. The multiplier 414[i,j,k] in each input and end stage 310(i,j) multiplies the feedback streams SF[i] by a respective multiplication factor. The summing device 415[i,0] in the beginning stage 310[i,0] sums the outputs of the multipliers 414[i,0,k] ($0 \leq k \leq Y-1$, where Y=2 in the embodiment) to the registering device 312[i,0] for generating an intermediate stream $R_{Y*j+i}=R_i$, where j=0. Similarly, the summing device 415[i,j] in the intermediate stage 310[i,j] except j=0 sums outputs of the multipliers 414[i,j,k] and an intermediate stream $R_{Y(j-1)+i}=R_{2(j-1)+i}$ from the preceding stage 310[i,j−1] to the registering device 312[i,j] for generating another intermediate stream $R_{Yj+i}=R_{2j+i}$.

The multiplication factor of the multipliers 414[i,j,k] is equal to the coefficient $C_{Yj+i}=C_{2j+i}$ of the characteristic polynomial P(x) for k=0 and $D_{Y*j+i}=D_{2j+i}$ for k=1, where the multiplication factor Dp is derived as:

$$D_P=C_{p-1}+C_p*C_X,$$

where $C_q=0$ if q<0.

Note that the described embodiment assumes for example that the number Y of LFSRs is 2. The invention is however, not limited thereto. Mathematically, if the order of the characteristic polynomial is X+1, the number of LFSRs is Y, the number of the multipliers in each of the input and the intermediate stages in each of the LFSRs is equal to Y when all multiplication factors are all non-zero. Additionally, if a $(k+1)_{th}$ one of the multipliers 414[i,j,k] in each of the input and the intermediate stages in each of the LFSRs is defined as the one receiving the feedback stream SF[k] generated by a $(k+1)_{th}$ one of the LFSRs, wherein $0 \leq k \leq Y-1$, then the multiplication factor of the $(k+1)_{th}$ multiplier in the $(j+1)_{th}$ one of the beginning and intermediate stages of the $(i+1)_{th}$ LFSR is $M_F(l,k)$, wherein $0 \leq j \leq Z_i-1$, $l=i+Y \times j$, $M_F(l,1)=C_l$, and $M_F(l, k+1)=M_F(l-1, k)+C_l \cdot M_F(YZ_i-1, k)$. It is noted that the multiplication factor $M_F(l,k)$ can be simplified into another form as $C_l$, $D_l$, $E_l$, $F_l$, and . . . for k=0, 1, 2, 3, and . . . , where $D_p=C_{p-1}+C_p*C_X$, $E_p=D_{p-1}+C_p*D_X$, $F_p=E_{p-1}+C_p*E_X$, and so on.

FIG. 4B is a more-detailed block diagram of a LSFR module 400' of FIG. 3A in accordance with another embodiment of the invention where it is assumed for example the number Y of the LFSRs is 4 and the order (X+1) is a multiple of 4. The structures of the logic networks 310(i,j) in FIG. 4B differ from those in FIG. 4A mainly in the increased number of multipliers, thus further description is omitted for brevity.

Figure 5A:
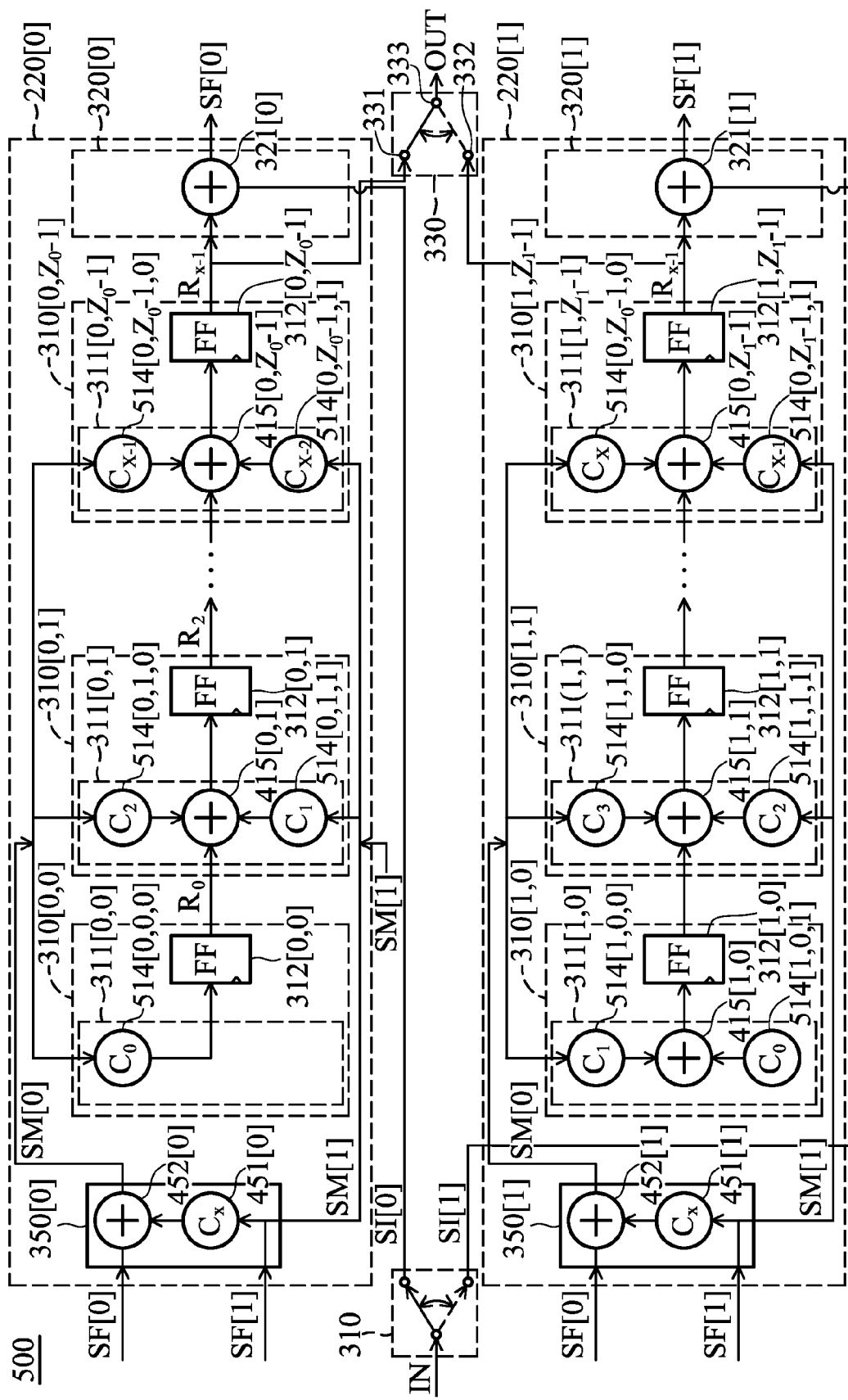
FIGS. 5A and 5B show more-detailed block diagrams of an LSFR module in accordance with two embodiments of FIG. 3B.

FIG. 5A is a more-detailed block diagram of a LSFR module 500 in accordance with an embodiment of FIG. 3B of the invention where it is assumed for example the number Y of the LFSRs is 2, the order X+1 of the characteristic polynomial P(x) is even for example. FIG. 5A differs from FIG. 4A in the addition of Y manipulative converters 350[0]-350[Y−1] and in the structures of the logic networks in the stages 310[i,j] ($0 \leq i \leq Y-1$, $0 \leq j \leq Z_i$).

As shown, the logic network 311[0,0] of the beginning stage 310[0.0] of the LFSR 220[0] comprises only one multiplier 514[0,0,0] multiplying the manipulated stream SM[0] by a multiplication factor equal to the coefficient $C_0$ for generating the intermediate stream $R_0$. Moreover, the multiplication factor of the multiplier 514[i,j,k] in the other beginning and intermediate stages 411[i,j] for $(i,j) \neq (0,0)$ is equal to $C_l$, where l=i+Y·j−k=i+2j−k, where k=0,1.

The manipulative converters 350[0]~350[Y−1] in FIG. 3B have identical structures. Shown correspondingly in FIG. 5A, the manipulative converter 350[i] for each value of i comprises a multiplier 451[i] (such as the multiplier 451[0]) and an adding device 452[i] (such as the multiplier 452[0]). With the configurations as shown, the manipulated stream SM[0] is equal to $C_X$SF[1]+SF[0], and SM[1] is equal to SF[1]. Other details of FIG. 5A are similar to those in the FIG. 4A and thus further description is omitted for brevity.

Note that in the illustrated embodiment in FIG. 5A, assuming for example that the number Y of LFSRs is 2. The invention, however, is not limited thereto. Mathematically, if the order of the characteristic polynomial is X+1, the number of LFSRs is Y, then the number of the multipliers in the beginning stage 310[y,0] of the $(y+1)_{th}$ one of the LFSRs is y+1, wherein $0 \leq y \leq Y-1$. Additionally, if the $(k+1)_{th}$ one of the multipliers in each of the intermediate stages in each of the LFSRs is defined as the one receiving the $(k+1)_{th}$ one of the manipulated stream, and the $(k'+1)_{th}$ one of the multiplier[s] in the beginning stage in the $(i+1)_{th}$ LFSR is defined as the one receiving the $(k'+1)_{th}$ one of the manipulated stream, wherein $0 \leq k \leq Y-1$ and $0 \leq k' \leq i$, then the multiplication factor of the $(k+1)_{th}$ multiplier in the $(j+1)_{th}$ one of the beginning and intermediate stages of the $(i+1)_{th}$ LFSR is $C_l$, wherein $0 \leq j \leq Z_i-1$ and $l=i+Y \cdot j-k$.

Furthermore, each of the LFSRs comprises the same manipulative converter to convert the feedback streams SF[0]-SF[Y−1] to the manipulated streams SM[0]-SM[1], wherein the (k″+1)$_{th}$ manipulated stream is M$_C$(k″) expressed as:

$$M_C(k'') = \sum_{i''''=k''}^{Y-1} M_F(X, i'''' - k'' - 1)SF[i''''],$$

wherein, $M_F(X,-1)=0$.

Figures 1, 5B:
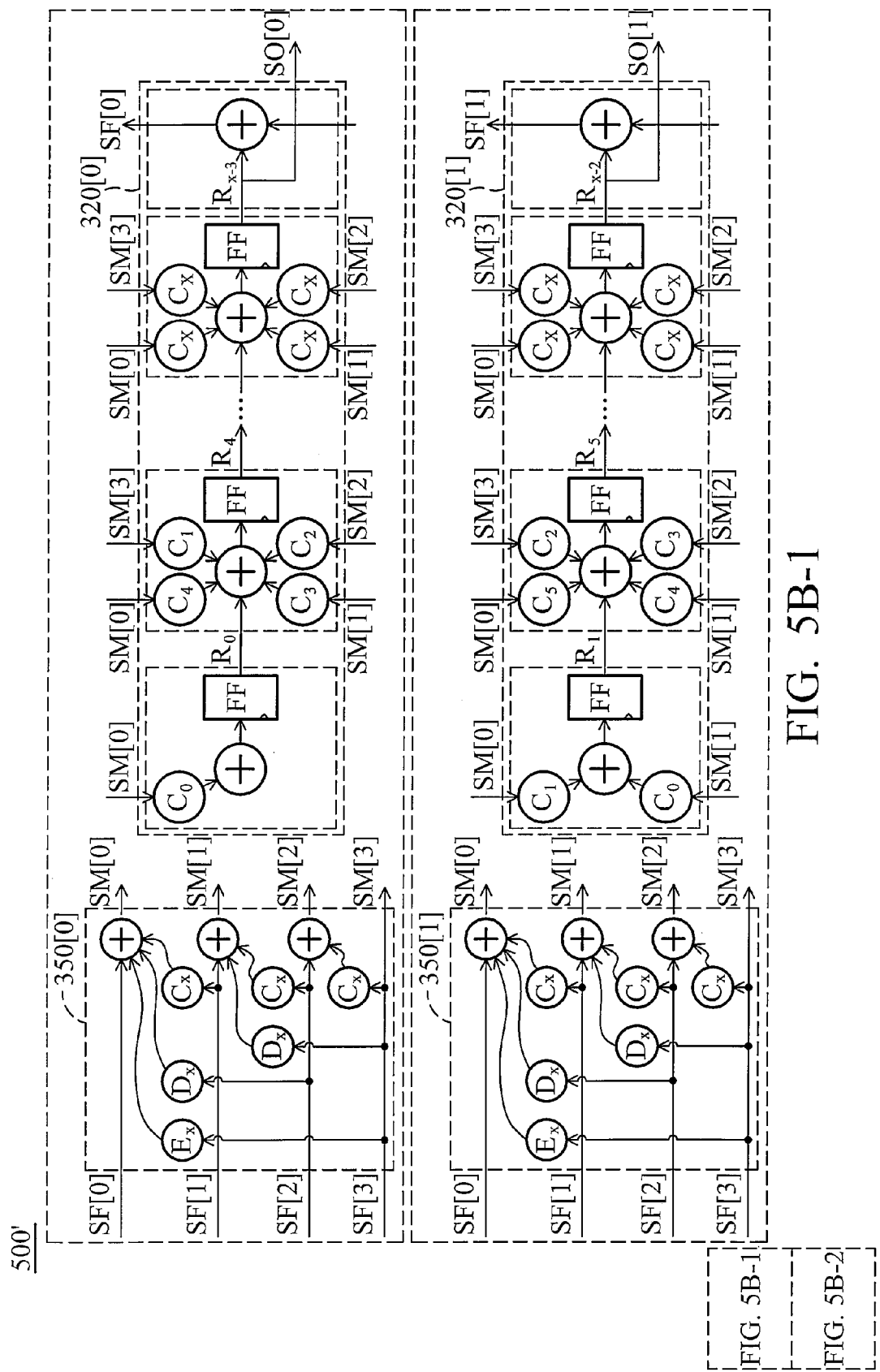
Figures 2, 5B:
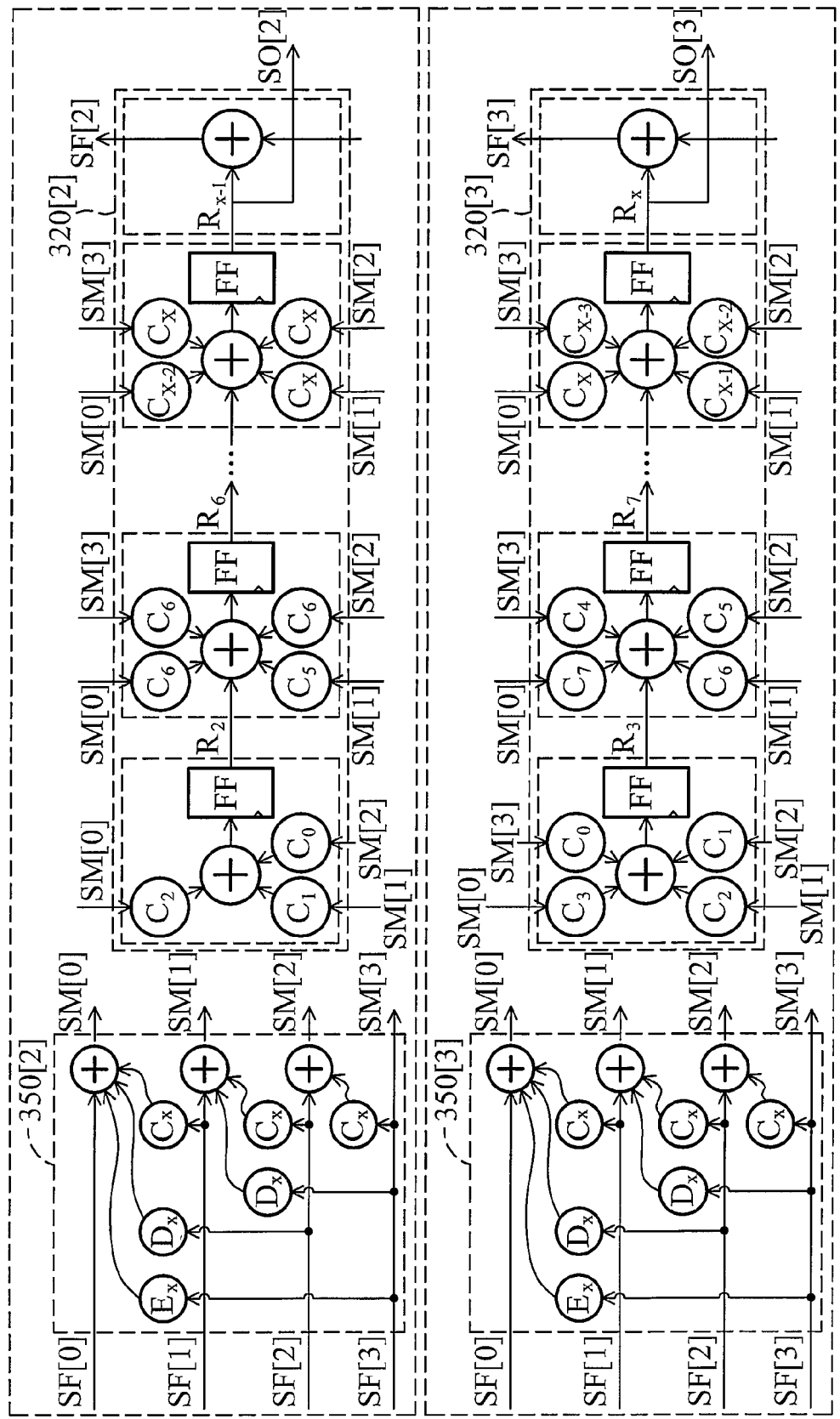

FIG. 5B is a more-detailed block diagram of an LSFR module 500′ in accordance with an embodiment of FIG. 4B of the invention, assuming for example that the number Y of the LFSRs is 4 and (X+1) is a multiple of 4. In this embodiment, it can be found that $SM[0]=SF[0]+SF[1]×C_x+SF[2]×D_x+SF[3]×E_x$ $SM[1]=SF[1]+SF[2]×C_x+SF[3]×D_x$ $SM[2]=SF[2]+SF[3]×C_x$ $SM[3]=SF[3]$ Other details are described in relation to FIG. 5A and thus further description is omitted for brevity.

Note that in the described embodiments in FIGS. 2, 3A-3B, 4A-4B and 5A-5B, the LFSR module receives only one input stream. The invention, however, is not limited thereto and can be applied as a Multiple Input Shift (or signature) Resister (MISR).

Figure 6A:
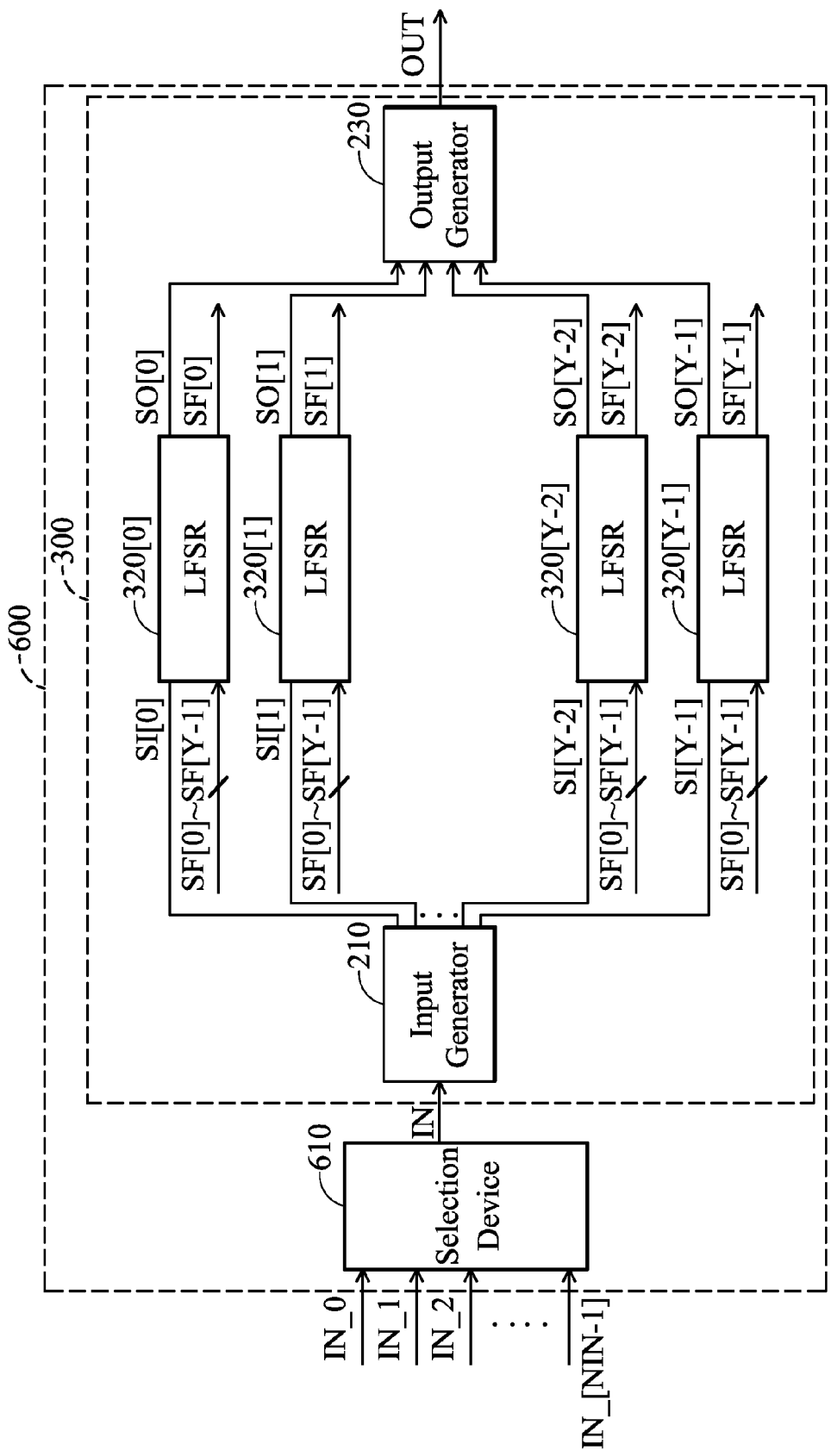
FIGS. 6A and 6B show block diagrams of LSFR modules in accordance with two embodiments of the invention in MISR applications.
Figure 6B:
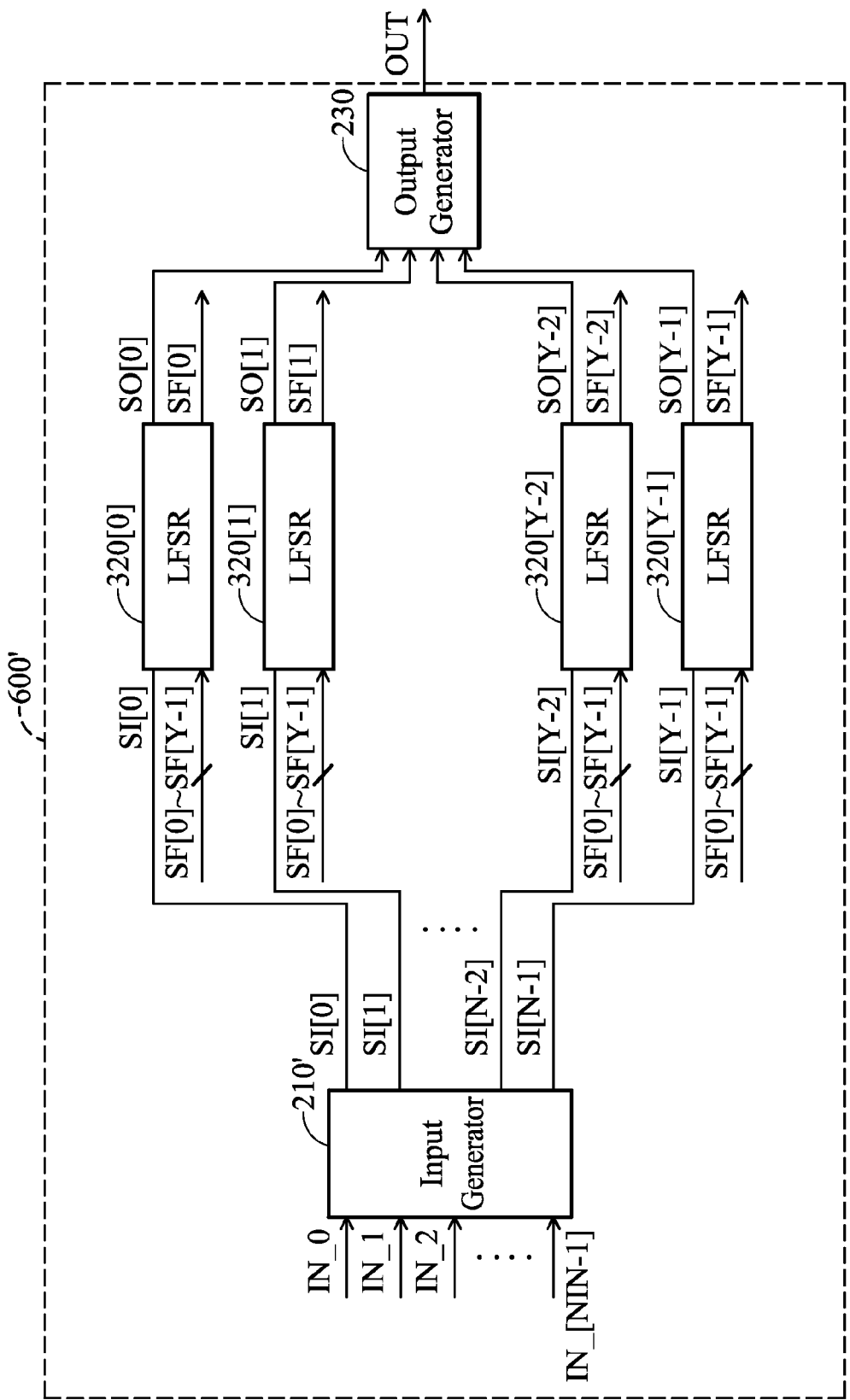

FIGS. 6A and 6B are block diagrams of LSFR modules 600 and 600′ in accordance with two embodiments of the invention. Referring to FIG. 6A first. The LFSR module 600 differs from the LFSR 200 of FIG. 2 in the addition of a selection device 610 coupled between a plurality of input streams IN_0 to IN_[NIN−1] and the input generator 210 for generating the input stream IN by receiving the input streams IN_0 to IN_[NIN−1]. Other details are described in relation to FIG. 3 and are thus omitted for brevity.

Now refer to FIG. 6B. The LFSR module 600′ differs from the LFSR 200 of FIG. 2 only in the replacement of the input generator 210 with another input generator 210′ receiving the input streams IN_0 to IN_[NIN−1] rather then the single input stream IN.

Figure 6C:
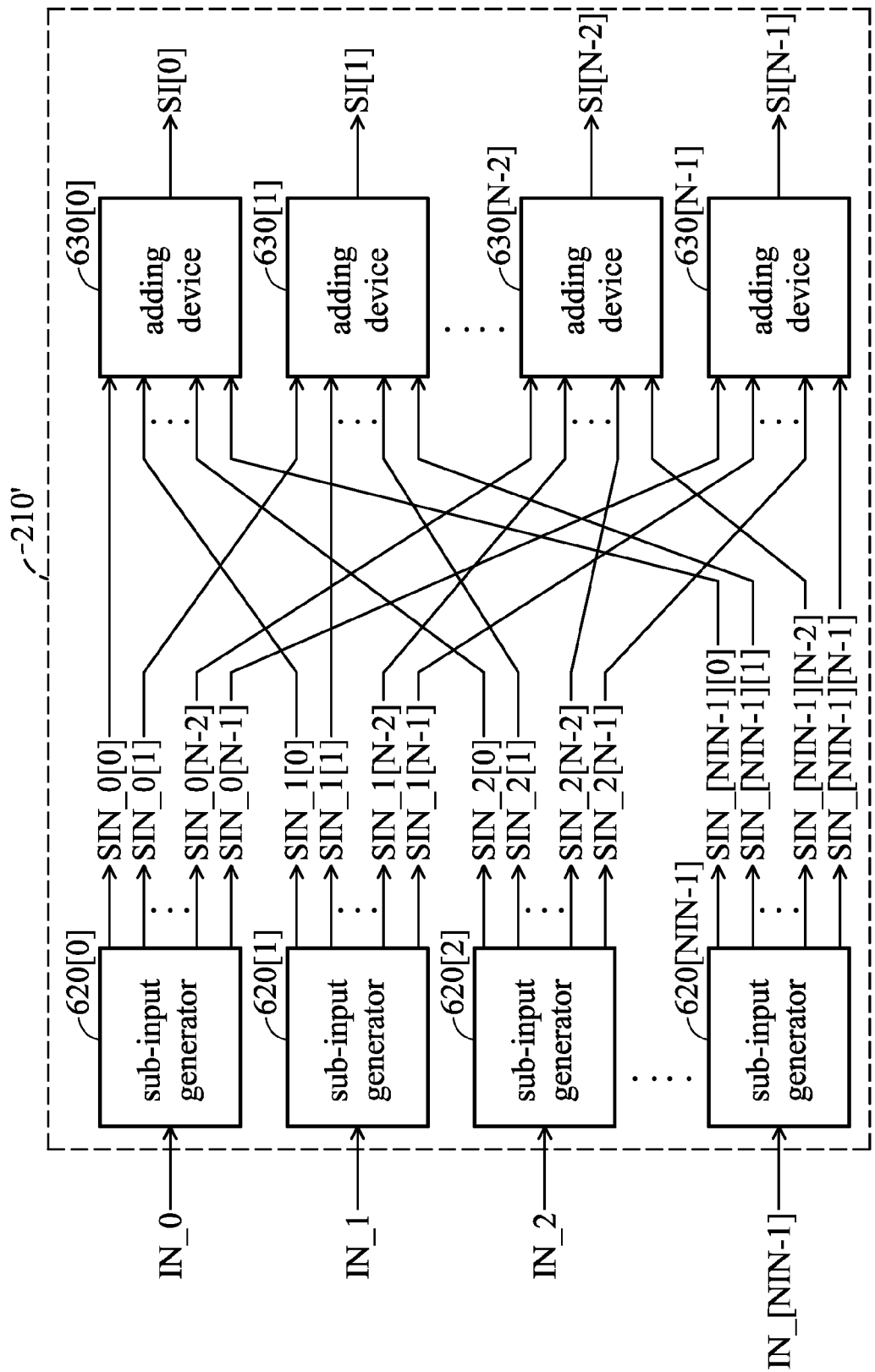
FIG. 6C is a block diagram of the input generator of FIG. 6B.

FIG. 6C is a block diagram of the input generator 210′ in FIG. 6B. As shown in FIG. 6C, the input generator 210′ comprises several sub-input generator 620[0]~620[NIN−1] and N adding devices 630[0]-630[N−1]. The sub-input generator 620[i] has a structure identical to the input generator 210 of FIG. 3A or 3B to decimate the input stream IN_i with a decimation interval equal to the number of LFSRs and synchronously produce the streams SIN_i[0]-SIN_i[N−1]. The adding device 630[j] then generates the sub-input stream SI[j] by adding the streams SIN_0[j]-SIN_[NIN−1][j]. Other details of FIG. 6B are described in relation to FIG. 2 and are thus omitted for brevity.

While the invention has been described by way of example and in terms of preferred embodiment, it is to be understood that the invention is not limited thereto. To the contrary, it is intended to cover various modifications and similar arrangements [as would be apparent to those skilled in the art]. Therefore, the scope of the appended claims should be accorded the broadest interpretation so as to encompass all such modifications and similar arrangements.

What is claimed is:

1. A linear feedback shift-register (LFSR) module configured according to a characteristic polynomial for generating an output stream according to an input stream, comprising:
a plurality of LFSRs coupled together, each LFSR respectively receiving a sub-input stream and at least one feedback stream, and respectively generating a sub-output stream and a feedback stream according to the received sub-input stream and the received at least one feedback stream,
wherein the sub-input stream is generated according to the input stream, and at least one of the received feedback streams is generated by another LFSR; and
an output generator generating the output stream according to a plurality of inputs,
wherein some of the inputs are the sub-output streams of the LFSRs.

2. The LFSR module as claimed in claim 1, wherein the sub-input stream of each of the LFSRs comprises a subset of the input stream.

3. The LFSR module as claimed in claim 2, wherein the sub-input stream of each of the LFSRs comprises the subset of the input stream with a predetermined decimation interval equal to the number of LFSRs.

4. The LFSR module as claimed in claim 1, wherein the output stream comprises a plurality of symbols of the sub-output streams of the LFSRs.

5. The LFSR module as claimed in claim 4, wherein the output stream further comprises a plurality of symbols of the sub-input streams or the input streams of the LFSRs.

6. The LFSR module as claimed in claim 1, wherein the input stream corresponds to a dividend polynomial and the output stream corresponds to a remainder polynomial of the dividend polynomial divided by the characteristic polynomial.

7. The LFSR module as claimed in claim 6, wherein a resulting sub-output stream of each of the LFSRs corresponds to a subset of coefficients of the remainder polynomial.

8. The LFSR module as claimed in claim 7, wherein the respective sub-output stream of each of the LFSRs corresponds to the decimation of the coefficients of the remainder polynomial with a predetermined decimation interval equal to the number of LFSRs.

9. The LFSR module as claimed in claim 6, wherein
the order of the characteristic polynomial is X+1,
the number of LFSRs is Y,
the number of the multiplier in each of the beginning and the intermediate stages in each of the LFSRs is equal to Y when the multiplication factors are all non-zero,
the (n×Y+i+1)$_{th}$ symbols of the input stream are provided sequentially as the sub-input stream of the (i+1)$_{th}$ LFSR, where $0 \leq i \leq Y-1$, n is an integer satisfying $n \geq 0$,
the number of the beginning and the intermediate stages in the (i″+1)$_{th}$ LFSRs is assumed to be $Z_{i''}$, wherein $0 \leq i'' \leq Y-1$ and $Z_{i''}$ is determined according to X and Y,
the feedback stream generated by a (k+1)th one of the LFSRs is provided as a (k+1)$_{th}$ feedback stream, wherein $0 \leq k \leq Y-1$,
a (k″+1)$_{th}$ one of the multiplier in each of the beginning and the intermediate stage in each of the LFSRs receives the (k″+1)$_{th}$ feedback stream, wherein $0 \leq k'' \leq Y-1$, and
the multiplication factor of the (k‴+1)$_{th}$ multiplier in the (j+1)$_{th}$ one of the beginning and intermediate stages of the (i‴+1)$_{th}$ LFSR is $M_F(l,k''')$, wherein $0 \leq i''' \leq Y-1$, $0 \leq j \leq Z_{i'''}-1$, $l=i'''+Yj$, $M_F(l,1)=C_l$, $M_F(l,k'''+1)=M_F(l-1k''')+C_l \cdot M_F(x,k''')$ for $k'''>0$, and $C_0$ to $C_x$ are the coefficients of the characteristic polynomial $$\sum_{i=0}^{X} C_i x^i + x^{X+1}.$$

10. The LFSR module as claimed in claim 6, wherein
the order of the characteristic polynomial is X+1,
the number of LFSRs is Y,
the number of the multiplier in each of the intermediate stages in each of the LFSRs is equal to Y when all multiplication factors are all non-zero, the $(n \times Y+i+1)_{th}$ symbols of the input stream are provided sequentially as the sub-input stream of the $(i+1)_{th}$ LFSR, where $0 \leq i \leq Y-1$, n is an integer satisfying $n \geq 0$, the number of the beginning and the intermediate stages in the $(i''+1)_{th}$ LFSRs is assumed to be $Z_{i''}$, wherein $0 \leq i'' \leq Y-1$ and $Z_{i''}$ is determined according to X and Y, a $(k+1)_{th}$ one of the multipliers in each of the intermediate stage in each of the LFSRs receives a $(k+1)_{th}$ one of the manipulated stream, wherein $0 \leq k \leq Y-1$, a $(k'+1)_{th}$ one of the multiplier(s) in the beginning stage in the $(i'''+1)$th LFSR receives a $(k'+1)_{th}$ one of the manipulated stream, wherein $0 \leq i''' \leq Y-1$ and $(Y-i''') \leq k' \leq Y-1$, the $(k''+1)_{th}$ manipulated stream is $M_c(k'')$, wherein $$M_C(k'') = \sum_{i''''=k''}^{Y-1} M_F(X, i''''-k''-1)SF[i''''],$$

wherein $M_F(X,-1)=0$, and $SF(i'''')$ is the feedback stream generated by the $(Y-i'''')$th LFSRs, the multiplication factor of the $k''''+1$ th multiplier in the $j+1$ th one of the beginning and intermediate stages of the $i''''+1$ th LFSR is $C_l$, wherein $0 \leq i'''' \leq Y-1$, $0 \leq j \leq Z_i-1$, $l=i''''+Y \cdot j-k'''$ and $C_l$ are the coefficients of the characteristic polynomial for $0 \leq l \leq X-1$ and zero for $l<0$, and the characteristic polynomial is $$\sum_{i=0}^{X} C_i x^i + x^{X+1}.$$

11. The LFSR module as claimed in claim 10, further comprising at least one manipulative converter each generating the manipulated stream according to the feedback streams generated by the LFSRs.

12. The LFSR as claimed in claim 11, wherein each of the LFSRs is coupled to a manipulative converter respectively.

13. The LFSR as claimed in claim 11, wherein at least one of the LFSRs further comprises a manipulative converter to covert the received at least one feedback stream to at least one manipulated stream and the LFSR generates the respective sub-output stream and the respective feedback stream according to the respective sub-input stream and the at least one manipulated stream.

14. The LFSR module as claimed in claim 1, further comprises an input generator to generate the sub-input streams according to the input stream.

15. The LFSR module as claimed in claim 1, further comprising a selection device receiving a plurality of second input streams for generating the input stream.

16. The LFSR module as claimed in claim 1, wherein each of the LFSRs comprises a plurality of stages coupled in series for sequential propagation of signals therethrough, the stages comprising a beginning stage, at least one intermediate stage, and an end stage, wherein the end stage generate the feedback stream of the LFSRs, and each of the beginning stage and the intermediate stage is coupled to at least one of feedback stream or manipulated stream, wherein each manipulated stream is provided according to at least one of the feedback streams of the LFSRs.

17. The LFSR module as claimed in claim 16, wherein the beginning stage in each of the LFSRs generates one of a plurality of intermediate streams according to the at least one of feedback stream or manipulated stream, and each intermediate stage of the LFSRs generates one of the plurality of intermediate streams according to the at least one of feedback stream or manipulated stream, and the intermediate stream received from the beginning stage or a preceding intermediate stream.

18. The LFSR module as claimed in claim 17, wherein each of the intermediate stage in each of the LFSRs comprises:

at least one multiplier each with a respective multiplication factor determined according to the characteristic polynomial; and a summing device summing outputs of the at least one multiplier.

19. A method to generate an output stream according to an input stream by operating with a characteristic polynomial and a linear feedback shift-register (LFSR) module having a plurality of LFSRs, comprising:

respectively receiving a sub-input stream and at least one feedback stream, and respectively generating a sub-output stream and a feedback stream according to the received sub-input stream and the received at least one feedback stream, wherein the sub-input stream is generated according to the input stream, and at least one of the received feedback streams is generated by another LFSR; and generating the output stream according to a plurality of inputs, wherein some of the inputs are the sub-output streams of the LFSRs.

20. The method as claimed in claim 19, wherein the sub-input stream of each of the LFSRs comprises a subset of the input stream.

21. The method as claimed in claim 20, wherein the sub-input stream of each of the LFSRs comprises the subset of the input stream with a predetermined decimation interval equal to the number of LFSRs.

22. The method as claimed in claim 19, wherein the output stream comprises a plurality of symbols of the sub-output streams of the LFSRs.

23. The method as claimed in claim 22, wherein the output stream further comprises a plurality of symbols of the sub-input streams or the input streams of the LFSRs.

24. The method as claimed in claim 19, wherein the input stream corresponds to a dividend polynomial and the output stream corresponds to a remainder polynomial of the dividend polynomial divided by the characteristic polynomial.

25. The method as claimed in claim 19, wherein each of the LFSRs comprises a plurality of stages coupled in series for sequential propagation of signals therethrough, the stages comprising a beginning stage, at least one intermediate stage, and an end stage, wherein the end stage generate the feedback stream of the LFSRs, and each of the beginning stage and the intermediate stage is coupled to at least one of feedback stream or manipulated stream, wherein each manipulated stream is provided according to at least one of the feedback streams of the LFSRs.

* * * * *